United States Patent [19]
Ogawa et al.

[11] Patent Number: 5,536,466
[45] Date of Patent: Jul. 16, 1996

[54] PROCESS FOR MANUFACTURING TRANSPARENT CONDUCTIVE FILM WIRING BOARD

[75] Inventors: Yukio Ogawa; Tatsuo Yamaura; Mamoru Namikawa; Akira Inoue, all of Mobara, Japan

[73] Assignee: Futaba Denshi Kogyo Kabushiki Kaisha, Mobara, Japan

[21] Appl. No.: 52,628

[22] Filed: Apr. 27, 1993

[30] Foreign Application Priority Data

Apr. 27, 1992 [JP] Japan ..................... 4-107945

[51] Int. Cl.$^6$ ..................................... B23K 26/00
[52] U.S. Cl. ..................... 264/400; 264/81; 264/430; 219/121.67; 427/108
[58] Field of Search ................... 264/25, 22, 81, 264/400, 430; 219/121.67

[56] References Cited

U.S. PATENT DOCUMENTS 4,081,654  3/1978  Mracek ................ 219/121.67
4,859,496  8/1989  Toyonaga ................ 427/53.1
5,160,675  11/1992  Iwamoto ................ 264/56

*Primary Examiner*—James Derrington
*Attorney, Agent, or Firm*—Oblon, Spivak, McClelland, Maier & Neustadt

[57] ABSTRACT

A process for manufacturing a transparent conductive film wiring board capable of being practiced according to a dry procedure to simplify the manufacturing and reduce the manufacturing costs. First, a $SiO_2$ layer is provided on a substrate and then a black ITO film is formed on the $SiO_2$ layer. The black ITO film is subject to processing using laser emitted from an output horn, resulting in being cut into a predetermined wiring pattern. Metal evaporated by laser processing is sucked by a vacuum suction head. Then, the substrate is subject to calcination to oxidize and crystallize the black ITO film 3 of the wiring pattern to form a transparent ITO film of the wiring pattern.

14 Claims, 3 Drawing Sheets

PROCESS FOR MANUFACTURING TRANSPARENT CONDUCTIVE FILM WIRING BOARD

BACKGROUND OF THE INVENTION

This invention relates to a process for manufacturing a transparent conductive film wiring board, and more particularly to a process for manufacturing a transparent conductive film wiring board using an indium tin oxide film (hereinafter referred to as "ITO film") which is adapted to be used for a display device such as an LGD, a VFD, a PDP or the like.

Now, a process for manufacturing a transparent conductive film wiring board which has been conventionally practiced will be described with reference to FIGS. 3A to 3E. First, as shown in FIGS. 3A and 3B, a transparent ITO film 101 is formed on a front surface of a glass substrate 100 by electron beam (EB) deposition or sputtering. This may be carried out by depositing ITO on the glass substrate 100 while heating the substrate and concurrently or thereafter subjecting the deposited ITO to crystallization to prepare the transparent ITO film 101.

Then, as shown in FIG. 3C, the ITO film 101 is formed thereon with a resist layer 102, which is then subject to exposure through a mask 103 of a predetermined pattern.

Subsequently, the resist layer 102 is contacted with a developing solution, resulting in a resist pattern 102a being formed as shown in FIG. 3D. Thereafter, the ITO film 101 is subject to etching through the resist pattern 102a by means of an etching liquid, so that an exposed portion of the ITO film is dissolved, to thereby provide a wiring pattern 101a of the ITO film 101 as shown in FIG. 3E.

Unfortunately, it has been found that the conventional process has some disadvantages. One of the disadvantages is that the process is carried out according to a wet procedure using a developing solution, an etching liquid and the like, so that facilities for a liquid-waste treatment are required, leading to an increase in facility costs and therefore manufacturing costs.

Another disadvantage is that the process causes the number of steps for the process to be increased, to thereby cause a long period of time to be required for the process, resulting in the productivity being deteriorated and the manufacturing costs being further increased.

SUMMARY OF THE INVENTION

The present invention has been made in view of the foregoing disadvantages of the prior art.

Accordingly, it is an object of the present invention to provide a process for manufacturing a transparent conductive film wiring board which is capable of being carried out according to a dry procedure.

It is another object of the present invention to provide a process for manufacturing a transparent conductive film wiring board which is capable of eliminating a liquid treatment, to thereby simplify the manufacturing, leading to a decrease in manufacturing costs.

In accordance with the present invention, a process for manufacturing a transparent conductive film wiring board is provided. The process comprises the steps of depositing a metal film on a substrate to form a transparent conductive film thereon and subjecting the transparent conductive film to pattern processing by means of a laser processing unit.

In accordance with the present invention, there is also provided with a process for manufacturing a transparent conductive film wiring board. The process comprises the step of forming a black ITO film on a substrate having insulating and heat-permeable properties. The ITO film is made of an indium oxide material which is lower than $In_2O_3$ and is doped with Sn. The process further comprises the steps of processing the black ITO film into a wiring pattern by means of a laser and then subjecting the substrate to calcination in an air atmosphere to form the black ITO film into a transparent ITO film.

In a preferred embodiment of the present invention, the substrate comprises a glass substrate having $SiO_2$ deposited thereon.

In a preferred embodiment of the present invention, the process further comprises the step of depositing an insulating layer on a portion of the substrate on which the black ITO film processed where the wiring pattern is not formed, followed by the step of subjecting the substrate to calcination.

In a preferred embodiment of the present invention, the step of processing the black ITO film into the wiring pattern is carried out in such a manner that metal of the black ITO film evaporated by the laser is removed by a removal means of a laser processing unit.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENT

Figure 1A:
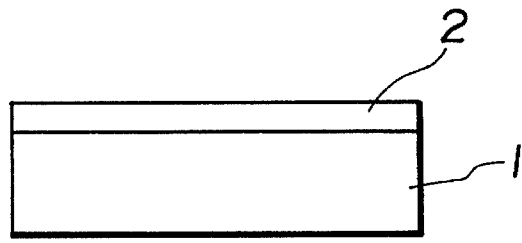
FIGS. 1A to 1E each are a schematic view showing each of steps of an embodiment of a process for manufacturing a transparent conductive film wiring board according to the present invention.
Figure 1B:
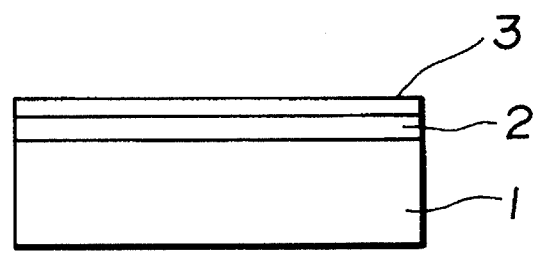

Now, a process for manufacturing a transparent conductive film wiring board according to the present invention will be described hereinafter with reference to FIGS. 1A to 1E and FIG. 2.

FIGS. 1A to 1E show an embodiment of a process for manufacturing a transparent conductive film wiring board according to the present invention. Reference numeral 1 designates a substrate which is used as a wiring board also acting as a front panel in a display device such as an LCD, a VFD, a PDP or the like. For this purpose, the substrate 1 may be made of, for example, a glass plate of about 6 mm in thickness.

However, it is desired that transfer of an alkaline ion such as $Na^+$, $K^+$ or the like from the substrate 1 is avoided, therefore, the substrate 1 is preferably made of a material free of any alkaline metal such as Na, K or the like. Nevertheless, when soda-lime glass generally known as a so-called plate glass which contains such alkaline metals as described above is used for this purpose, a $SiO_2$ (silica) layer 2 is formed all over an upper surface of the substrate 1 as shown in FIG. 1A. This may be accomplished by forming the $SiO_2$ layer 2 having a thickness of 1000A on the substrate by roll coating, dipping or the like and then subjecting the $SiO_2$ layer 2 to calcination at about 530° C.

Then, the substrate 1 is set in an EB depositing unit, wherein the substrate 1 is subject to EB deposition while using a tablet made of $In_2O_3$ deposed with $SnO_2$ in an amount of 3 to 10% $In_2O_3$ and doped with Sn, namely, $In_2O_x$ (0<x<3) such as, [or as a deposition source and keeping the substrate 1 at a room temperature. This results in an indium oxide material lower than example, InO, $In_2O$ or the like which is an indium oxide material lower than $In_2O_3$ and is doped with Sn being formed on the $SiO_2$ layer of the substrate 1, as indicated at reference numeral 3 in FIG. 1B. The oxide $In_2O_x$ is referred to as "black ITO film" because of having a black color. The black ITO film 3 is formed into a thickness of 500 to 1000Å.

Then, the black ITO film is subject to a heating treatment in an ambient atmosphere such as an air atmosphere, so that InO or $In_2O$ which is lower indium oxide than $In_2O_3$ is oxidized and crystallized into $In_2O_3$, resulting in a transparent ITO film being formed. Thereafter, an unnecessary portion of the transparent ITO film is subject to vaporization using laser beams, to thereby form a pattern. In this regard, it was found that the transparent ITO film is deteriorated in laser absorbing capacity or efficiency, therefore, direct processing of the transparent ITO film with laser requires a laser processing unit exhibiting an increased output.

Also, it was found that an increase in laser outputting capacity of the laser processing unit causes controlling of a thickness of a layer evaporated to be highly troublesome or substantially impossible, resulting in evaporation of only the transparent ITO film being substantially difficult. Further, this causes laser to reach the $SiO_2$ layer and substrate 1 underlying the ITO film, leading to evaporation of the $SiO_2$ and substrate and therefore damage thereto.

In view of the above, it was found that laser processing with respect to the black ITO film permits the laser absorbing efficiency to be significantly improved, so that laser processing may be satisfactorily carried out while keeping an output of the laser processing unit low.

Now, this will be more detailedly described hereinafter.

Figure 2:
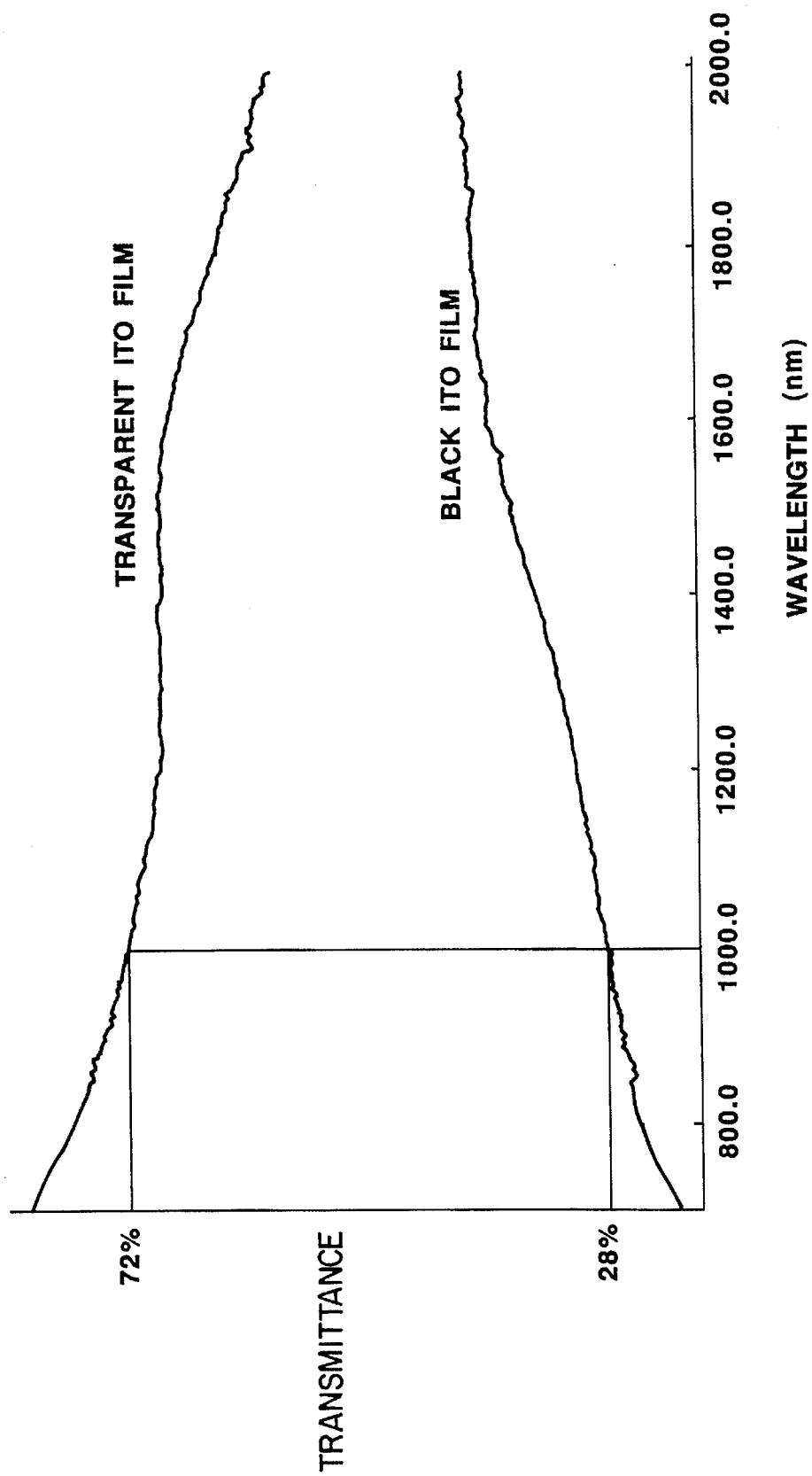
FIG. 2 is a graphical representation showing infrared spectroscopic transmittance of each of a transparent ITO film and a black ITO film.
Figure 3A:
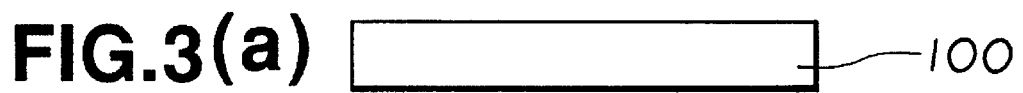
FIGS. 3A to 3E each are a schematic view showing each of steps of a conventional process for manufacturing a transparent conductive film wiring board.
Figure 3B:
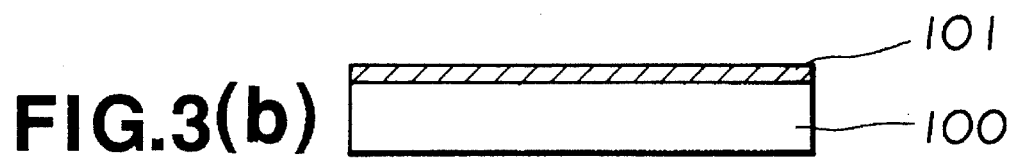
Figure 3C:
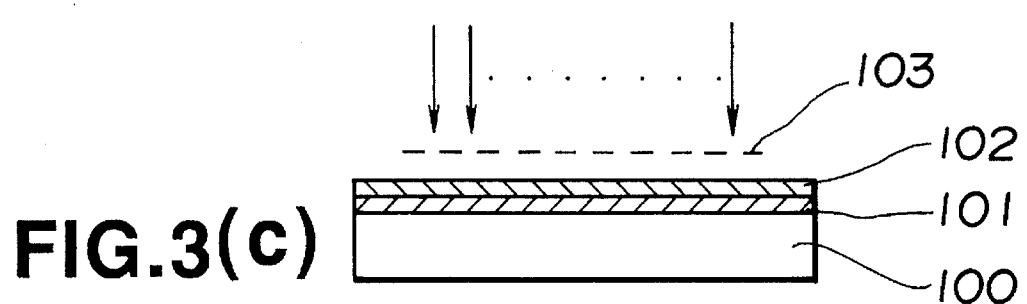
Figure 3D:
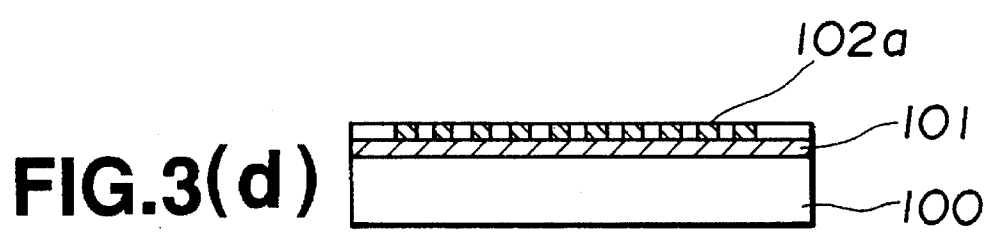
Figure 3E:
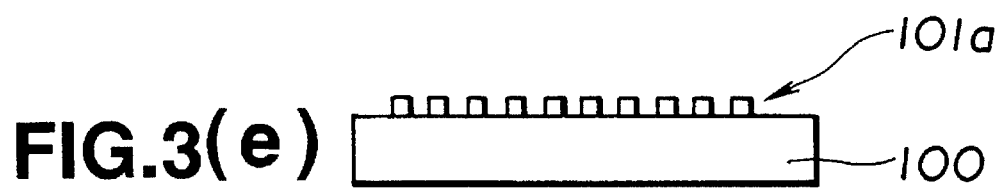

As described above, the substrate 1 is kept at a room temperature rather than an elevated temperature during the EB deposition, so that In metal contained in the black conductive ITO film 3 is prevented from being oxidized. This prevents the black conductive ITO film 3 from constituting crystals of $In_2O_3$. More particularly, the black ITO film 3 comprises transparent $In_2O_3$ of increased transmittance having In and Sn contained therein in the form of metal, resulting in exhibiting, as a whole, transmittance reduced to a degree sufficient to be observed to be black. Measurement made by the inventor indicated that infrared spectroscopic transmittance of the black ITO film 3 is 28% at a wavelength of 1000 nm as shown in FIG. 2.

Figure 1C:
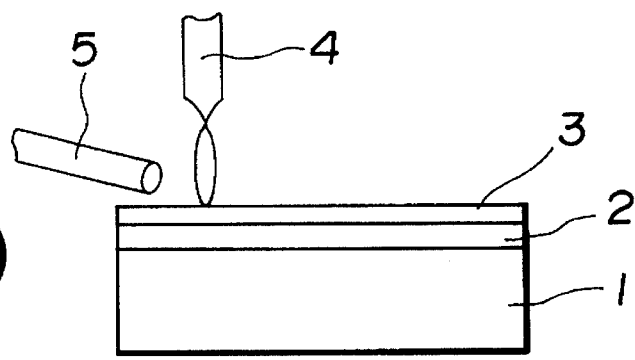
Figure 1D:
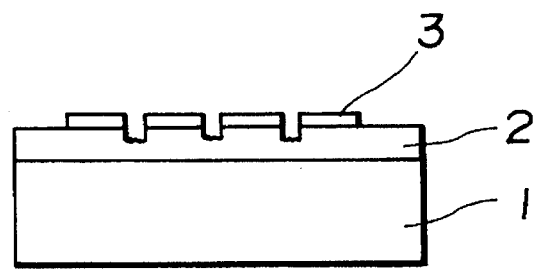

Then, an unnecessary portion of the black ITO film 3 is melted and evaporated by means of YAG laser (wavelength: 1 μm) as shown in FIG. 1C, so that the black ITO film 3 may be cut into a wiring pattern as shown in FIG. 1D. The ITO film 3 which is being exposed to laser beams is black, therefore, laser energy absorbing efficiency of the black ITO film 3 is satisfactorily improved by 2.6 times as compared with that of the transparent ITO film. Thus, the illustrated embodiment permits a laser processing unit of a low output to be used for this purpose.

Also, the laser processing unit to be used in the illustrated embodiment, as shown in FIG. 1C, is provided with a vacuum suction head 5 in a manner to be positioned in proximity to a laser beam emitter 4 of the laser processing unit. The vacuum suction head 5 functions to suck metal evaporated from the ITO film during the laser processing, to thereby prevent the metal evaporated from adhering to the substrate 1. Thus, it will be noted that the vacuum suction head 5 acts as a metal removal means. Alternatively, the laser processing unit may be provided with an air discharge nozzle likewise acting as the metal removal means in place of the vacuum suction head 5, to thereby blow off the metal vapor while diluting it with air. This exhibits substantially the same advantage as described above.

Figure 1E:
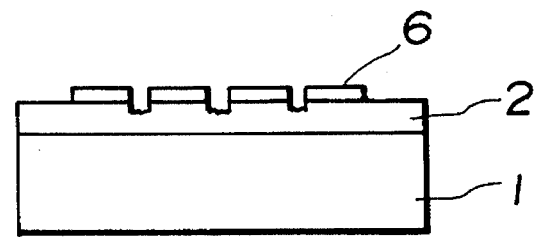

Subsequently, the substrate 1 on which the wiring pattern of the black ITO film 3 is thus formed by cutting using the laser processing unit is subject to calcination at a calcination peak temperature of 560° C. for 10 minutes in an air atmosphere. This causes In in the black ITO film 3 which is a film of a mixture of $In_2O_3$ metal doped with Sn and In to be crystallized, leading to a transparent ITO film 6 having such a wiring pattern as shown in FIG. 1E. An experiment made by the inventor indicated that infrared spectroscopic transmittance of the transparent ITO film 6 is 72% at a wavelength of 1000 nm, as shown in FIG. 2.

In the embodiment described above, the black ITO film 3 is cut by means of the laser processing unit and then immediately subject to calcination, resulting in forming the transparent ITO film 6. Alternatively, the embodiment may be practiced in such a manner that an insulating layer of a black color which mainly consists of frit glass is deposited on a portion of the black ITO film 3 except the wiring pattern by thick film printing after the cutting, resulting in the portion of the black ITO film 3 on which the insulating layer 3 is formed forming a black background with respect to the wiring pattern of the black ITO film 3 which functions a display section of a display device completed. In this instance, the black insulating layer may be fixed and subject to calcination at 560° C. after the deposition. This permits crystallization of the ITO film to be concurrently carried out.

As can be seen from the foregoing, the process of the present invention permits the dry procedure to be used for formation of the wiring pattern, to thereby eliminate management of liquid such as an etching liquid, a developing solution, a waste liquid or the like, resulting in reducing the facility costs and therefore the manufacturing costs and preventing environmental pollution.

Also, the process of the present invention permits a period of time required for forming the ITO film to be reduced to a level one half as long as a conventional process wherein a transparent ITO film is deposited all over a substrate and then formed into a predetermined pattern by photolithography. Also, the present invention permits the subsequent crystallization step to be carried out concurrent with calcination of the black insulating layer, to thereby reduce the number of steps.

Further, in the present invention, the wiring pattern is formed by cutting using the laser processing unit. This further reduces the number of steps of the process as compared with formation of the wiring pattern by photolithography in the prior art. Thus, the present invention simplifies manufacturing of the transparent conductive film wiring board and reduces the manufacturing time.

In addition, the black ITO film which satisfactorily absorbs laser energy with high efficiency is subject to cutting, so that the cutting is carried out while keeping the output of the laser processing unit at a low level, resulting in preventing damage to the SiO$_2$ film and substrate underlying the black ITO film.

Moreover, the present invention effectively prevents metal evaporated from the black ITO film from adhering to the substrate by providing the metal removal means in proximity to the laser beam emitter.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A process for manufacturing a transparent conductive film wiring board comprising the steps of:

depositing a non-transparent metal film on a substrate to form a conductive film thereon;

subjecting said conductive film to pattern processing by means of a laser processing unit; and transforming the conductive film into a transparent film.

2. A process as defined in claim 1, wherein said substrate comprises a galss substrate having SiO$_2$ deposited therein.

3. A process for manufacturing a transparent conductive film wiring board comprising the steps of:

forming a black ITO film on a substrate having insulating and heat-permeable properties, said black ITO film being made of an indium oxide material doped with Sn according to the equation:

In$_2$O$_x$, wherein X=0<X<3;

processing said black ITO film into a wiring pattern by means of a laser; and subjecting said substrate to calcination in an air atmosphere to form said black ITO film into a transparent ITO film.

4. A process as defined in claim 3, wherein said substrate comprises a glass substrate having SiO$_2$ deposited thereon.

5. A process as defined in claim 3, further comprising the step of depositing an insulating layer on a portion of said substrate on which said black ITO film processed into said wiring pattern is not formed, followed by said step of subjecting said substrate to calcination.

6. A process as defined in claim 3, wherein said step of processing said black ITO film into said wiring pattern is carried out in such a manner that metal of said black ITO film evaporated by laser is removed by a removal means of a laser processing unit.

7. A process for manufacturing a transparent conductive film wiring board comprising the steps of:

forming a black ITO film made of a doped indium oxide material on a substrate;

vaporizing unwanted portions of the black ITO film to form a wiring pattern using laser beams, said laser beams absorbed by the black ITO film; and heating the wiring pattern to oxidize the black ITO film to form transparent ITO crystal.

8. The process according to claim 7, further comprising the steps of:

forming a silica layer on the substrate before forming the black ITO film to ensure that no alkaline metals taint the ITO crystal; and calcinating the silica layer into transparent crystal.

9. The process according to claim 8, wherein the silica is at least 1000 angstrom thick.

10. The process according to claim 7, wherein the substrate is made of a material that is not tainted with an alkaline metal.

11. The process according to claim 7, wherein the step of forming the black ITO film further comprises:

setting the substrate in an electro-beam depositing unit, the depositing unit using a tablet made of In$_2$O$_3$ deposed with SnO$_2$; and maintaining the substrate at room temperature during the deposition to prevent the black ITO film from crystallizing.

12. The process according to claim 7, wherein the laser beams are generated by a YAG laser.

13. The process according to claim 12, wherein the wavelength of the laser beams are 1 micrometer.

14. The process according to claim 7, further comprising the steps of:

removing excess black ITO film particles caused by the laser beams using a vacuum.

* * * * *